United States Patent [19]

Taesang

[11] Patent Number: 5,510,955
[45] Date of Patent: Apr. 23, 1996

[54] CAGE IN COMPUTER EQUIPMENT FOR LOCKING PERIPHERAL EQUIPMENT THEREWITHIN USING HOOKED LOCKPINS

[75] Inventor: Kim Taesang, Suwon, Rep. of Korea

[73] Assignee: Samsung Electronics Co., Ltd., Suwon, Rep. of Korea

[21] Appl. No.: 317,514

[22] Filed: Oct. 4, 1994

[30] Foreign Application Priority Data

Oct. 4, 1993 [KR] Rep. of Korea .................. 93-20231 U

[51] Int. Cl.⁶ ..................................... H05K 5/00
[52] U.S. Cl. .......................... 361/685; 361/683; 361/726
[58] Field of Search .................................. 361/679–685, 361/724–726

[56] References Cited

U.S. PATENT DOCUMENTS

| | | | |
|---|---|---|---|
| 4,896,777 | 1/1990 | Lewis | 361/685 |
| 5,305,180 | 4/1994 | Mitchell et al. | 361/725 |

FOREIGN PATENT DOCUMENTS

| | | |
|---|---|---|
| 855314 | 8/1985 | Rep. of Korea . |
| 8911364 | 7/1989 | Rep. of Korea . |
| 932630 | 5/1993 | Rep. of Korea . |
| 9315516 | 7/1993 | Rep. of Korea . |
| 9315492 | 7/1993 | Rep. of Korea . |

*Primary Examiner*—Gerald P. Tolin
*Assistant Examiner*—Jayprakash Gandhi

[57] ABSTRACT

A cage in a piece of computing equipment with a rectangular opening in a surface of that equipment is adapted for having inserted therewithin a piece of peripheral equipment with a rectangular front plate and with first and second guide rails located along its first and second sides, respectively, each having a circular hole of a prescribed diameter therethrough at prescribed distance from the front plate. The cage has first and second lead rails on first and second opposed sides thereof with which lead rails the first and second guide rails respectively engage. The lead rails each having a circular hole of the prescribed diameter therethrough to align with the hole in the guide rail it engages, when the inserted peripheral equipment is fully inserted. The cage has a third side extending between edges of its first and second sides, which third side has first and second holes therethrough of said prescribed diameter. Hooked locking pins have their shanks inserted through these holes and aligned holes in the lead and guard rails, for retaining the piece of peripheral equipment within the cage. The hooked locking pins are spring-loaded and are twisted after their insertion so that their hooked portions engage with hooked catches located near the holes in the third side of the cage.

19 Claims, 5 Drawing Sheets

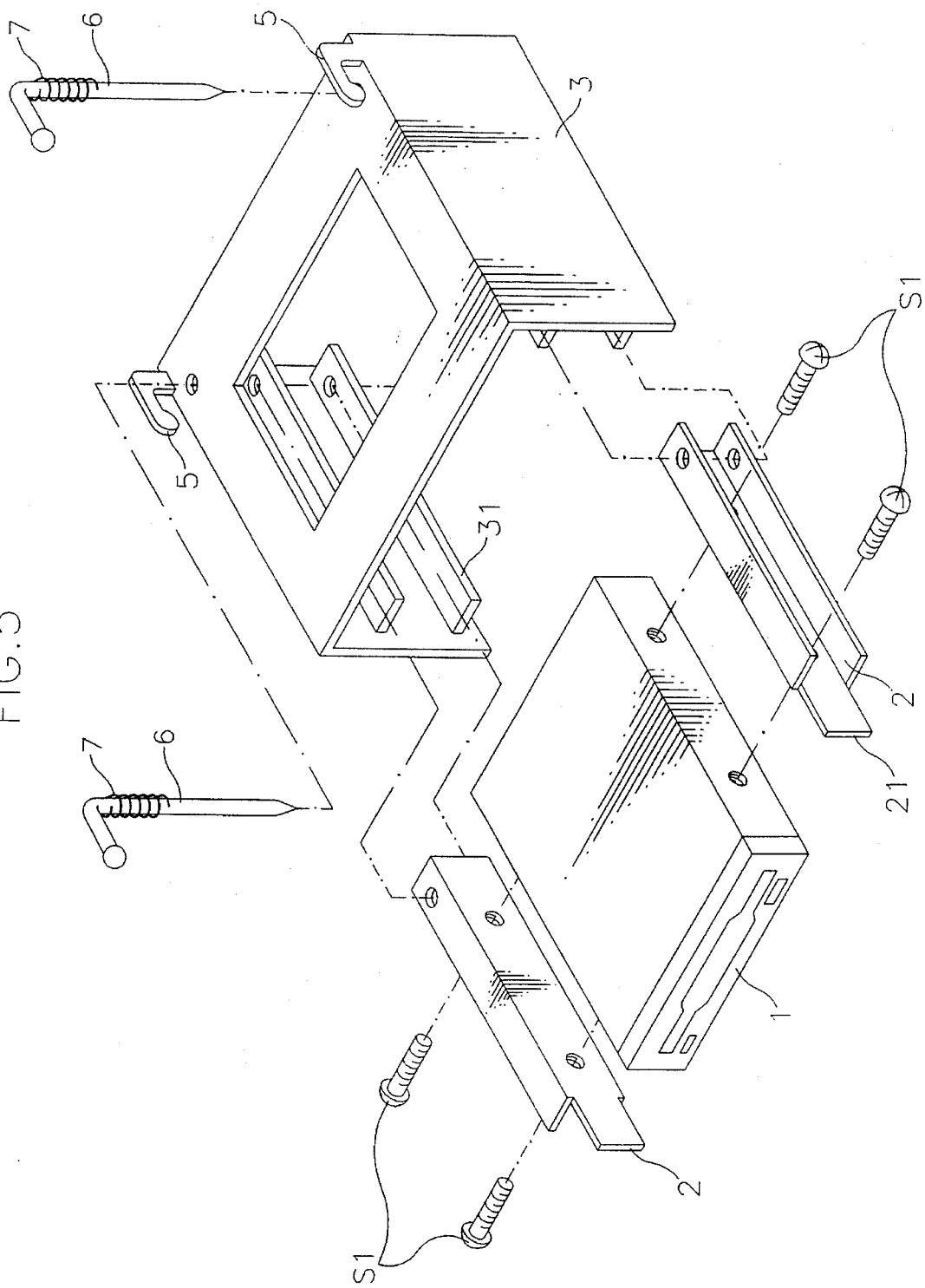

CAGE IN COMPUTER EQUIPMENT FOR LOCKING PERIPHERAL EQUIPMENT THEREWITHIN USING HOOKED LOCKPINS

The invention relates to incorporating peripheral equipment into a computer and, more particularly, to cages in computer equipment for locking pieces of peripheral equipment therewithin using hooked lockpins that engage with hooked catches on the outsides of the cages.

BACKGROUND OF THE INVENTION

A personal computer generally has to have provision for the installation of at least three pieces of peripheral equipment therein, two floppy disk drives and a hard disk drive being likely to be installed therein. It is advantageous to be able to arrange such pieces of peripheral equipment with their front panels in close packed array, either stacked up vertically or side-by-side horizontally, and to reduce the space required around each of them. This permits designers to reduce the size of the computer, to make more room for its other components, or to make room for additional components. The cavity in the surface of a piece of computing equipment into which a piece of peripheral equipment is inserted and fastened or locked is called a "cage" in this disclosure.

Generally, connection of a piece of peripheral equipment such as a hard disk drive or floppy disk drive within a cage in a computer body can be classified as being of guide rail type, screw type, or spring guide type. Examples of these types of connection arrangement known in the prior art will now be described with reference to the accompanying drawing.

FIG. 1 shows a guide rail type connection arrangement disclosed in Korean Utility Model Unexamined Publication No. 89-11364 (published on Jul. 13, 1989) entitled "A Fastening Device For a Floppy Disk Drive And Hard Disk Drive". In this guide rail type connecting device, guide rails 2 are attached to the side of a piece 1 of peripheral equipment by screws S1 and the piece 1 of peripheral equipment is then pushed into a cage 3 so that the guide rails 2 engage with lead rails on the interior side walls of the cage 3. Then, the guide rails 2 on the piece 1 of peripheral equipment are fastened to a front portion of the cage 3 by means of screws S2. The problem with this guide rail type connecting device is that the spacing required for the respective screws S2 in adjoining guide rails prevents very close side-by-side arrangement of a plurality of the cages 3.

FIG. 2 depicts a screw type connection arrangement disclosed in Korean Utility Model Unexamined Publication No. 85-5314 (published on Aug. 10, 1985) entitled "A Fastening Device For A Computer Hard Disk Drive". A piece 1 of peripheral equipment inserted within a cage 3 is secured therewithin using screws S1 inserted through the sidewalls of the cage 3. Screws S1 on both sides of the piece 1 of peripheral equipment have to be tightened during assembly and have to be untightened during disassembly. However, if other devices or frames are on either or both sides of the peripheral equipment, there are problems with accessing the screws S1.

FIG. 3 illustrates a spring guide type connection arrangement disclosed in Korean Utility Model Unexamined Publication No. 93-2630 (published on May 17, 1993) entitled "A Fastening Structure For a Peripheral Equipment In A Computer" and Korean Utility Model Unexamined Publication No. 93-15492 (published on Jul. 28, 1993) entitled "A Mounting Device For A Personal Computer Drive". Spring guides 4 which engage detents in lead rails within a cage are used for retaining the piece 1 of peripheral equipment within the cage after its insertion thereinto. These retaining springs 4 avoid the need for the screws S2 required by the FIG. 1 guide rail type connecting device in order to retain the piece 1 of peripheral equipment within the cage. However, a space large enough to push a hand or tool must be left along each side in order to be able to operate the spring guides 4, which prevents close side-by-side arrangement of a plurality of the cages. The assembly of the retaining springs 4 with the guide rails 2 is somewhat more complex than one would like and is usually implemented with a special jig. The retention capabilities of the springs depends on the width dimensions of the piece of peripheral equipment being held to fairly close tolerance.

Korean Utility Model Unexamined Publication No. 93-15516 (published on Jul. 28, 1993) entitled "A Fastening Device For A Disk Drive" discloses a connecting device including a tripping sill and tripping groove in order to avoid the need for the screws S2 required by the FIG. 1 guide rail type connecting device in order to retain the piece 1 of peripheral equipment within the cage. However, this connecting device undesirably interferes with the stacking of pieces of peripheral equipment one above the other.

The inventor sought to economize the interior space of desk top computers by utilizing a different type of connection arrangement that would reduce the need for leaving space around the cage(s) for peripheral equipment.

SUMMARY OF THE INVENTION

A cage with a rectangular opening at a surface of a piece of computing equipment is adapted for having inserted therewithin a piece of peripheral equipment and embodies the invention in one of its aspects. The piece of peripheral equipment has a rectangular front plate, respective first and second sides parallel to each other and perpendicular to the rectangular front plate, and a first guide rail located along its first side. The rectangular opening has a perimeter comprised of a set of equal-length first and second edges oppositely disposed respective to each other and a set of equal-length third and fourth edges oppositely disposed respective to each other. The first and second edges are of sufficient length to admit the first and second sides of the piece of peripheral equipment in respective proximity thereto. The third and fourth edges are of such length that the rectangular front plate fills at least a portion of the rectangular opening between its said first and second edges. The first guide rail has a circular hole of a prescribed diameter therethrough along the extent thereof at a first prescribed distance from the rectangular front plate. The cage is constructed to permit the piece of peripheral equipment being secured thereto using a first hooked locking pin, which has a substantially cylindrical shank portion of a diameter somewhat less than the prescribed diameter and has a hooked portion at substantially a right angle to its shank portion. The cage comprises first, second and third sides of the cage, a first lead rail located along the first side of the cage, and a first hooked catch on the third side of the cage. The first and second sides of the cage are parallel to each other and perpendicular to the surface of the piece of computing equipment at said first and second edges respectively of the rectangular opening in that surface. The first lead rail is located along the first side of the cage for engaging with the first guide rail of the piece of peripheral equipment and extends perpendicularly from the first edge of the rectangular opening in the surface of the piece of computing equipment. The first lead rail has a circular hole of said prescribed diameter therethrough along the extent thereof at substantially the first prescribed distance from the first edge of the rectangular opening. The third side of the cage is perpendicular to the first and second sides of the cage, between which it extends, and has a first circular hole of the prescribed diameter therethrough. The third hole is located such that a first perpendicular axis through its center extends through the center of the hole through the first lead rail and defines a first locus for the insertion of the shank portion of the first hooked locking pin. The first hooked catch is located near the first circular hole and has its hook opening towards the third side of the cage, being disposed for capturing the hooked portion of the first hooked locking pin when forced thereagainst after the piece of peripheral equipment is inserted into the cage, the shank portion of the first hooked locking pin is inserted through the first hole through the third side of the cage and the holes in the first guide rail and the first lead rail aligned therewith along the first locus, and the hooked portion of the first hooked locking pin is pivoted on its shank portion so as to engage with the first hooked catch.

Certain of the cages embodying this aspect of the invention are adapted for having inserted therewithin a piece of peripheral equipment that also has a second guide rail, located along its second side and provided with a circular hole of the prescribed diameter therethrough along the extent thereof at a second prescribed distance from its rectangular front plate. Such a cage further comprises a second lead rail for engaging with the second guide rail on the second side of the peripheral equipment, which second lead rail is located along the second side of the cage and extends perpendicularly from the second edge of the rectangular opening in the surface of the computing equipment. The second lead rail has a circular hole of the prescribed diameter therethrough along the extent thereof at substantially a second prescribed distance from the second edge of the rectangular opening. There is a second circular hole of the prescribed diameter through the third side of such a cage located such that a second perpendicular axis through its center extends through the center of the hole through the second lead rail and defines a second locus for the insertion of the shank portion of a second hooked locking pin. Such a cage also further comprises a second hooked catch located near that second circular hole, with its hook opening towards the third side of the cage, and disposed for capturing the hooked portion of the second hooked locking pin when forced thereagainst after the piece of peripheral equipment is inserted into the cage, the shank portion of the second hooked locking pin is inserted through the second hole through the third side of the cage and those holes in the guide and lead rails aligned therewith along the second-locus, and the hooked portion of the second hooked locking pin is pivoted on the shank portion of the second hooked locking pin so as to engage with the second hooked catch.

Further aspects of the invention concern the methods for using the cages described in the previous two paragraphs together with the hooked locking pins, for retaining pieces of peripheral equipment within pieces of computer equipment.

BRIEF DESCRIPTION OF THE DRAWING

FIG. 5 is an exploded perspective view of a cage for a piece of peripheral equipment for a computer which cage is included in a connection arrangement that embodies the invention in a preferred form and that uses hooked locking pins engaging with hooked catches for retaining the piece of peripheral equipment within the cage.

DETAILED DESCRIPTION OF THE INVENTION

Figure 1:
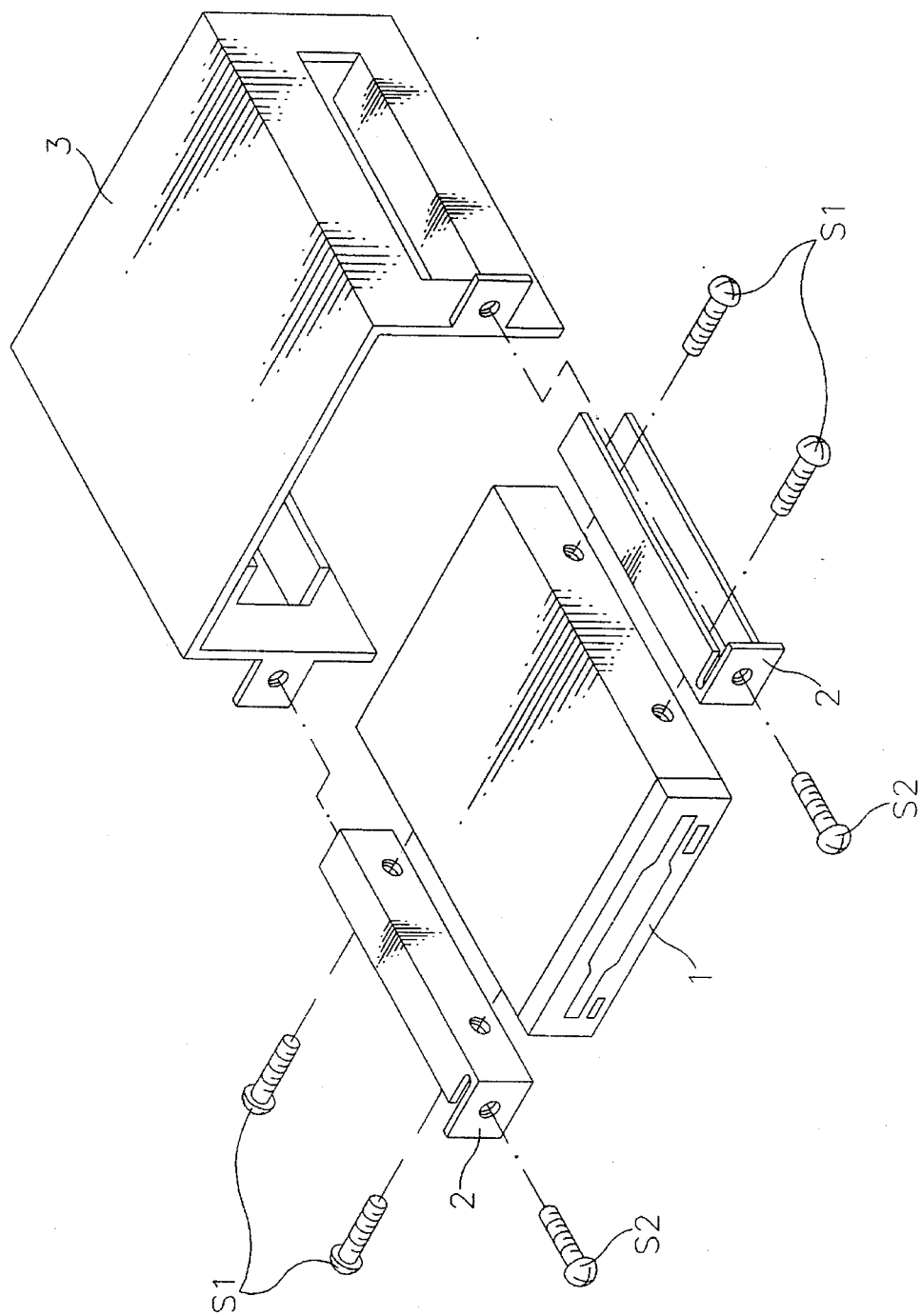
FIG. 1 is an exploded perspective view of a guide rail type connection arrangement in accordance with a prior art technique.
Figure 2:
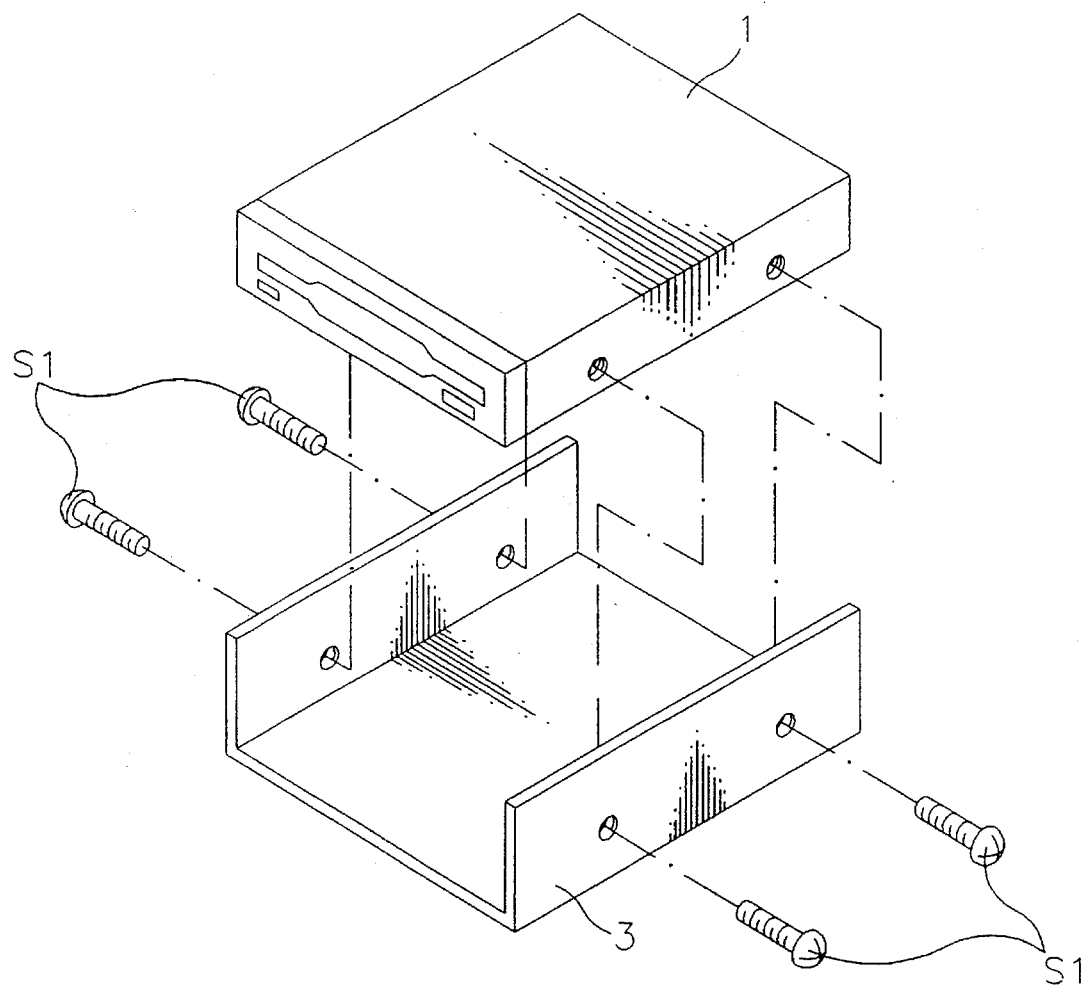
FIG. 2 is an exploded perspective view of a screw type connection arrangement in accordance with a prior art technique.
Figure 4:
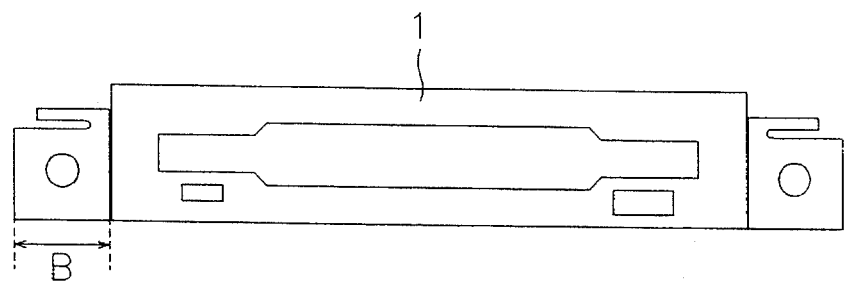
FIG. 4 is a frontal view of a peripheral equipment including the prior art guide rail connection arrangement as shown in FIG. 1.
Figure 3:
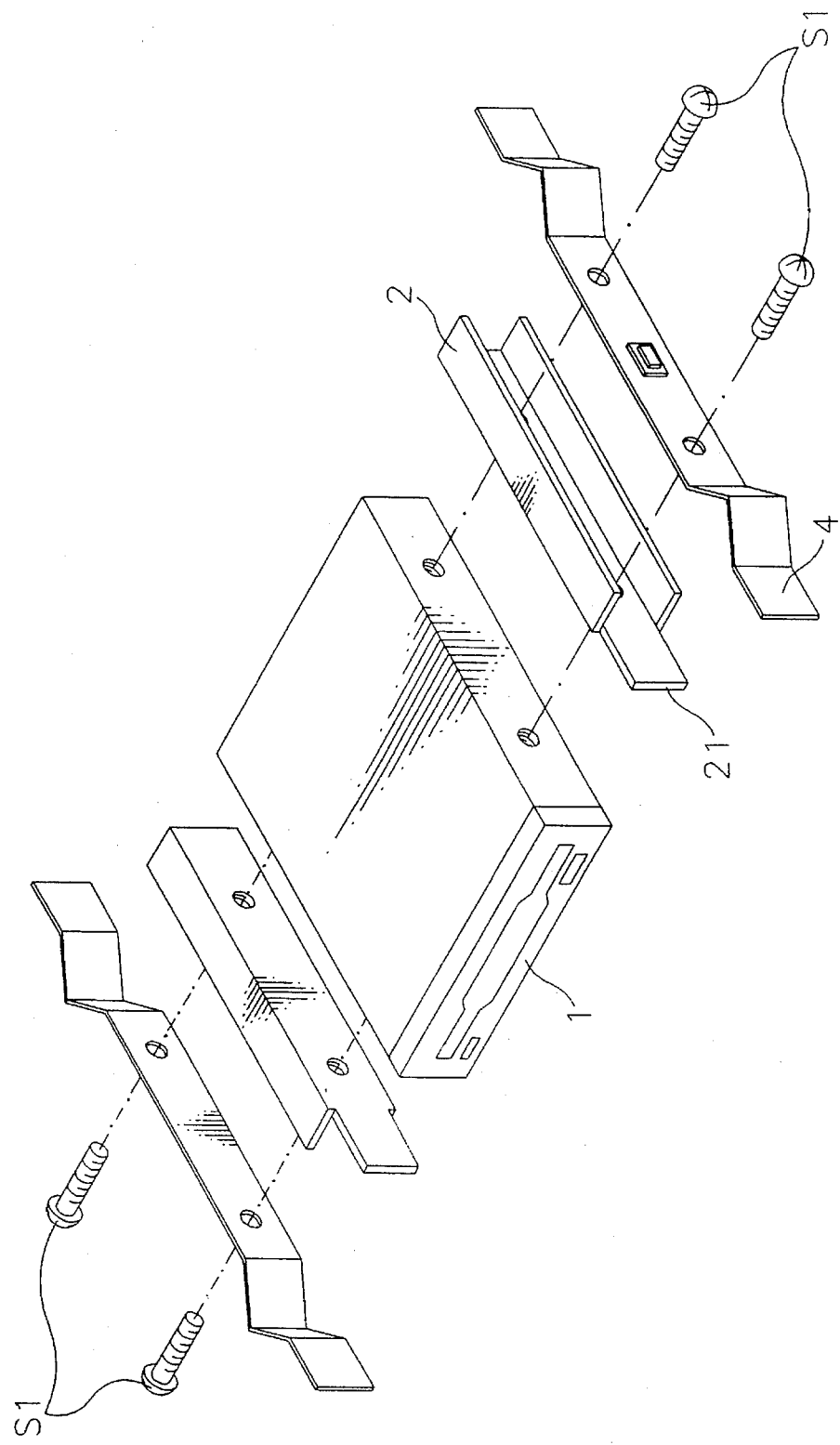
FIG. 3 is an exploded perspective view of a spring guide type connection arrangement in accordance with a prior art technique.
Figure 6:
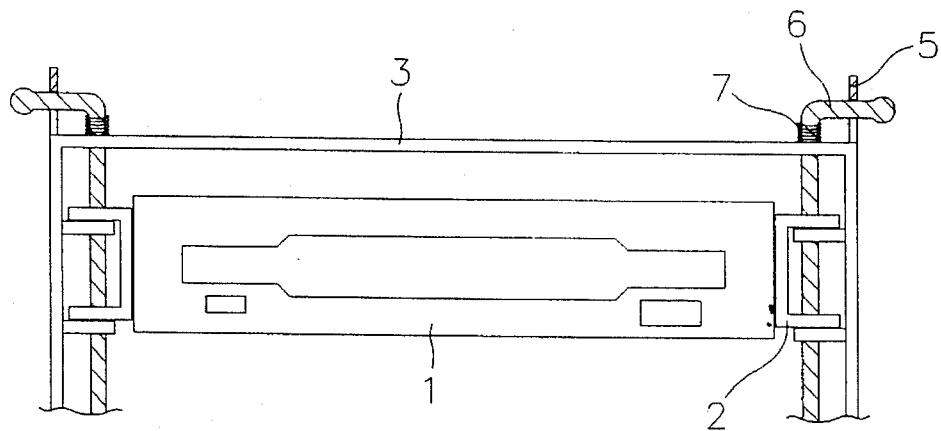
FIG. 6 is a frontal view of a cage for a piece of peripheral equipment for a computer, included in a connection arrangement that embodies the invention in a preferred form, with the hooked locking pins engaging with hooked catches atop the cage.

Referring to FIG. 5 and to FIG. 6, a piece 1 of peripheral equipment has a respective guide rail structure 2 along the outside surface of first and second opposite sides thereof, being attached thereto by means of screws S1 by way of example. Each guide rail structure 2 is doubly flanged and each flange thereof is considered to be a guide rail. Alternatively, the guide rail structures 2 might be attached by some other fastening, such as spot welds, or might be formed as portions of the side surfaces—e.g. as portions of a casting or molding. The piece 1 of peripheral equipment has a rectangular front plate. The first and second (e.g., left and right) sides of the piece 1 of peripheral equipment are parallel to each other and are perpendicular to the rectangular front plate. Each flange or guide rail portion of the first guide rail structure 2, which is located along the first side of the piece 1 of peripheral equipment, has a circular hole of a prescribed diameter therethrough at a first prescribed distance from the rectangular front plate. Each flange or guide rail portion of the second guide rail structure 2, which is located along the second side of the piece 1 of peripheral equipment, has a circular hole of the prescribed diameter therethrough at a second prescribed distance from the rectangular front plate. FIG. 5 shows these prescribed first and second distances as being equal, each to the other, and sufficiently long as to place the holes in the guide rails near the back of the piece 1 of peripheral equipment.

A cage 3 is arranged so that the front thereof fits into a rectangular opening in a surface of the piece of computer equipment containing the cage 3, which surface is usually the face or front of the piece of computer equipment. Usually, the rectangular front plate of the piece 1 of peripheral equipment is to be substantially flush with the surface of the piece of computer equipment surrounding the cage 3 when the piece 1 of peripheral equipment is fully inserted within the cage 3. The cage 3 has respective lead rails 31 on the inside surfaces of first and second opposed sides thereof to support or to lead the guide rails of corresponding guide rail structures 2 attached to the sides of the piece 1 of peripheral equipment. Each of the lead rails 31, as will support or lead a guard rail having a circular hole of the prescribed diameter therethrough at the first prescribed distance from the rectangular front plate of the piece 1 of peripheral equipment, has a corresponding circular hole of the prescribed diameter therethrough at a distance from the surface of the piece of computer equipment surrounding the front of the cage 3 that is substantially equal to the first prescribed distance. Each of the lead rails 31, as will support or lead a guard rail having a circular hole of the prescribed diameter therethrough at the second prescribed distance from the rectangular front plate of the piece 1 of peripheral equipment, has a corresponding circular hole of the prescribed diameter therethrough at a distance from the surface of the piece of computer equipment surrounding the front of the cage 3 that is substantially equal to the second prescribed distance.

Figure 7A:
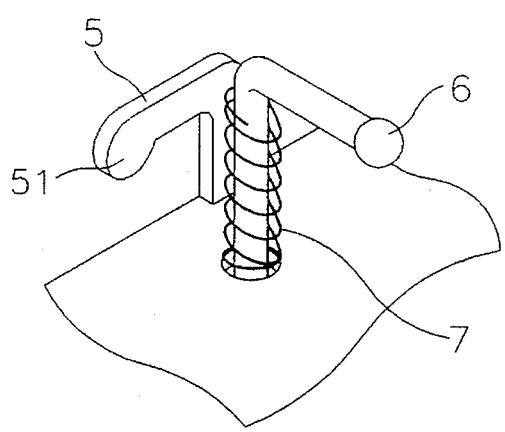
FIG. 7A is a perspective view of a hooked locking pin and hooked catch in an unlocked state as used in a preferred embodiment of the present invention.
Figure 7B:
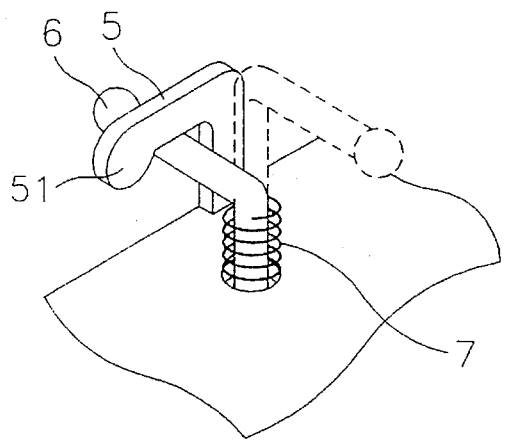
FIG. 7B is a perspective view of a hooked locking pin and hooked catch in an locked state as used in a preferred embodiment of the present invention.

The cage 3 has a third side, shown as being the top of cage 3 in FIGS. 5 and 6, which third side extends between the first and second opposed sides of cage 3, shown as being the left and right sides of cage 3 in FIGS. 5 and 6. The first, third and second sides of the cage 3 can be assembled as separate pieces or can be formed as an integral structure using a casting, a molding, or bent sheet metal. The lead rails 31 can be a part of an integral structure using a casting, which is preferably a light-weight one (e.g., of aluminum alloy). When the first, third and second sides of the cage 3 are formed from a bent piece of sheet metal, the lead rails 31 can formed from L-shape or channel shape pieces spot-welded thereto. These structures are exemplary of those possible. The third side (top) of the cage 3 has a first circular hole of the prescribed diameter therethrough near the first side of the cage 3, at a distance from the surface of the piece of computer equipment surrounding the front of the cage 3 that is substantially equal to the first prescribed distance. This first circular hole is located such that a first perpendicular axis through its center extends through the center of each hole in each lead rail on the first side of the cage 3 and defines a first locus for the insertion of a shank portion of a hooked locking pin. The third side (top) of the cage 3 has a second circular hole of the prescribed diameter therethrough near the second side of the cage 3, at a distance from the surface of the piece of computer equipment surrounding the front of the cage:3 that is substantially equal to the second prescribed distance. This second circular hole is located such that a second perpendicular axis through its center extends through the center of each hole in each lead rail on the second side of the cage 3 and defines a second locus for the insertion of a shank portion of a hooked locking pin. The first and second holes in the third side (top) of the cage 3 have respective catches 5 near them. Each of these catches 5 has a hook shape with a hook opening towards the third side (top) of cage 3. The one of the catches 5 near the first circular hole in the third side (top) of the cage 3 is disposed such that its hook opening can capture a hooked portion of a hooked locking pin as forced thereagainst by a respective compression spring after the pin is inserted and pivoted around its shank portion. The one of the catches 5 near the second circular hole in the third side (top) of the cage 3 is disposed such that its hook opening can capture the hooked portion of a hooked locking pin as forced thereagainst by a respective compression spring after the pin is inserted and pivoted around its shank portion. The hook opening in each of the catches 5 is shaped (e.g., with a lip as shown in FIGS. 5, 7A and 7B) so that the hooked portion of the locking pin cannot escape through simple turning unaccompanied by releasing or overcoming the force pushing the hooked portion of the locking pin into that hook opening.

A locking pin 6 shown in FIG. 5 exemplifies the type of hooked locking pins referred to in the previous paragraph. The locking pin 6 has a substantially cylindrical shank portion of a diameter somewhat less than said prescribed diameter and has a hooked portion at substantially a right angle to its shank portion. The shank portion departs from being circularly cylindrical in preferably being pointed at the end thereof distal from the hooked portion to facilitate its insertion through holes in the cage 3 and the guide rail structure 2 of a piece 1 of peripheral equipment. The shank portion of the locking pin 6 can be threaded through a coil spring 7 that provides the compression spring for forcing the hooked portion of the locking pin 6 into the hook opening of a respective catch 5 after the pin is inserted into the cage 3 through one of the first and second holes in the third side (top) and turned. The use of the coil spring 7 permits easy replacement of the compression spring if it tires, but the spring may be lost when installing peripheral equipment. Alternatively (or additionally) a captive leaf compression spring may be installed near the bottom of the cage 3 so as to press against the point of the locking pin 6 after its insertion is completed.

The apparatus shown in FIGS. 5 and 6 uses lead rails 31 that support the guide rails or flange portions of the doubly flanged guide rail structures 2. This has the advantage of looser tolerance requirement on the height of the piece of peripheral equipment since it can be lifted up somewhat and has the advantage that insertion need not be done very precisely. Arrangements where the guide rails attached to the peripheral equipment are designed to fit over lead rails 31 or pluralities of lead rails 31 are used in apparatus that are alternative embodiments of the invention. Arrangements where the guide rails attached to the peripheral equipment are designed to fit between pairs of lead rails 31 are used in other apparatus that are further alternative embodiments of the invention. The use of more than one guard rail on each side of the piece of peripheral equipment and of at least one lead rail proximate each guide rail is preferred in that there is less possibility of the position of the piece of peripheral equipment twisting once the lock pins are inserted.

The apparatus shown in FIGS. 5 and 6 uses catches 5 that are at the edges of the top of the cage 3 adjoining other sides of the cage, which facilitates certain methods of fabricating the cage. The catches 5 can be fabricated at the back edge of the top instead, supposing the first and second holes in the top of the cage being sufficiently close to that back edge that the hooked portions of the locking pins will engage the hooked openings of the catches 5. Other locations of the catches 5 near the first and second holes in the top of the cage are of course possible, being turned up as tabs in a sheet metal structure, for example.

In FIG. 5 the holes for the left locking pin 6 are shown as being at the same distance from the front of the cage 3 as the holes for the right locking pin 6 are; this is a matter of convenience rather than of necessity. When the cage 3 shown in FIGS. 5 and 6 is incorporated into a computer in the position shown, the locking pins can be accessed by providing a removable rear cover or housing for the computer. This is facilitated by having the first and second holes in the top of the cage 3 and the holes in the lead rails 31 near the back of the cage 3. Alternatively the locking pins can be accessed through openings or recesses in the top of the computer, in which case the first and second holes in the top of the cage 3 and the holes in the lead rails 31 can be at any distance from the front of the cage 3. The cage 3 shown in FIGS. 5 and 6 may be turned upside down before its incorporation into a computer, so the locking pins are accessed through openings or recesses in the bottom of the computer. In such case the first and second holes in the bottom of the cage 3 and the holes in the lead rails 31 can be at any distance from the front of the cage 3.

The apparatus shown in FIGS. 5 and 6, which embodies one aspect of the invention, is employed according to the following method of incorporating peripheral equipment into a piece of computing equipment using the apparatus, which embodies another aspect of the invention. First, the guide rail structures 2 with appropriate holes for receiving locking pins are attached to the left and right sides of the piece 1 of peripheral equipment, which can be done using screws S1. As the piece 1 of peripheral equipment is slid into the cage 3, the guide rails on the piece 1 of peripheral equipment engage with the lead rails 31 attached to or formed on the insides of the left and right sidewalls of the cage 3. The piece 1 of peripheral equipment may be designed to be slid into the back of the cage 3 if the piece of computer equipment is provided with a removable back cover or housing. Alternatively, the piece 1 of peripheral equipment may be designed to be slid into the front of the cage 3, with a faceplate sufficiently wide to extend beyond the guide rail structures 2.

A user adjusts the position of the piece 1 of peripheral equipment in order to align holes in the left and right guide rail structures 2 on the piece 1 of peripheral equipment, the holes in the lead rails 31 on the interiors of the left and right sides of the cage of the cage 3, and the holes in the left and right sides of the cage 3 top. Then, a respective locking pin 6 is threaded through a respective coil compression spring 7 and inserted into one of the sets of aligned holes for retaining the piece 1 of peripheral equipment within the cage 3. A further respective locking pin 6 can be threaded through a respective coil compression spring 7 and inserted into another of the sets of aligned holes further to retain the piece 1 of peripheral equipment.

To remove the piece 1 of peripheral equipment from the cage 3, the hooked portion of each locking pin 6 is pressed and turned to unlock it from its respective catch 5. Each locking pin 6 is withdrawn from the cage 3, permitting the removal of the piece 1 of peripheral equipment from the cage 3.

FIGS. 7A and 7B are perspective views illustrating the hooked catch 5 and the hooked locking pin 6 in unlocked and locked states in an arrangement for installing a piece of peripheral equipment in a computer in accordance with an aspect of the invention. After the locking pin 6 is inserted through a holes of the cage 3 top, as shown in FIG. 7A, and through corresponding holes in one or more lead rails 31 formed on the inside of the cage 3 and possibly through corresponding holes in guide rails of a guide rail structure 2, the user presses the locking pin 6 to compress the compression spring 7, rotates the locking pin 6 so the hooked portion thereof is aligned with the hook opening or notch in the catch 5, and releases the locking pin 6. Releasing the locking pin 6 allows the compression spring 7 to force the locking pin 6 to engage the hook opening or notch in the catch 5, as shown in FIG. 7B. Thereafter, the piece 1 of peripheral equipment is locked within the cage 3. The round lip 51 at the edge of the hook opening of the catch 5 keeps the hooked portion of the locking pin from unlocking unless the spring 7 is compressed.

If additional lead rails 31 are attached to the inside of each side of the cage 3, a plurality of pieces of peripheral equipment with attached guide rails can be stacked within the cage 3, with each locking pin having a respective shaft portion of extended length for threading a hole in the top of the cage 3 and the holes aligned therewith in the lead rails on the corresponding side of the cage 3 and in the guide rails of the pieces of peripheral equipment.

Different-width cages of the type embodying the invention can be stacked, particularly if stacked in stepped order. Stacking in stepped order can be done aligning the first sides of the different-width cages so a common locking pin with a long shaft portion can be used by them; separate locking pins will have to be used for the second sides of the different-width cages because of their step offset(s). Stacking in stepped order can alternatively be done by centering the cages one over the other, in which case separate locking pins are used for each cage.

Arrangements wherein pieces of peripheral equipment with guide rails on the top and bottom are arranged with locking pins accessed through openings or recesses in the side of the computer are also possible. Such arrangements lend themselves to side-by-side placement of equal-height pieces of peripheral equipment.

While this invention has been described in regard to preferred embodiment thereof, it is to be understood that the invention is not limited to the disclosed embodiments, but, on the contrary, extends over various modifications and equivalent arrangements included within the spirit and scope of the appended claims.

What is claimed is:

1. A cage with a rectangular opening at a surface of a piece of computing equipment; said cage for having inserted therewithin a piece of peripheral equipment with a rectangular front plate, with respective first and second sides parallel to each other and perpendicular to said rectangular front plate, and with a first guide rail located along said first side thereof, said first guide rail having a circular hole of a prescribed diameter therethrough along the extent thereof at a first prescribed distance from said rectangular front plate; said rectangular opening having a perimeter comprised of a set of equal-length first and second edges oppositely disposed respective to each other and a set of equal-length third and fourth edges oppositely disposed respective to each other, said first and second edges being of sufficient length to admit the first and second sides of said piece of peripheral equipment in respective proximity thereto, said third and fourth edges being of such length that said rectangular front plate fills at least a portion of said rectangular opening between its said first and second edges; said cage being of such construction as to permit said piece of peripheral equipment being secured thereto using a first hooked locking pin, said first hooked locking pin having a substantially cylindrical shank portion of a diameter somewhat less than said prescribed diameter and having a hooked portion at substantially a right angle to its said respective shank portion; said cage comprising:

first and second sides of said cage parallel to each other and perpendicular to said surface of said piece of computing equipment at said first and second edges respectively of said rectangular opening in said surface of said piece of computing equipment;

a first lead rail located along said first side of said cage tier engaging with said first guide rail of said piece of peripheral equipment and extending perpendicularly from said first edge of said rectangular opening in said surface of said piece of computing equipment, said first lead rail having a circular hole of said prescribed diameter therethrough along the extent thereof at substantially said first prescribed distance from said first edge of said rectangular opening;

a third side of said cage, perpendicular to said first and second sides of said cage, and extending between said first and second sides of said cage, said third side of said cage having a first circular hole of said prescribed diameter therethrough located such that a first perpendicular axis through its center extends through the center of said hole through said first lead rail and defines a first locus for the insertion of said shank portion of said first hooked locking pin; and a first hooked catch located near said first circular hole of said prescribed diameter through said third side of said cage, said first hooked catch having its hook opening towards said third side of said cage, said first hooked catch thereby being disposed for capturing said hooked portion of said first hooked locking pin when forced thereagainst after said piece of peripheral equipment is inserted into said cage, said shank portion of said first hooked locking pin is inserted through said first hole through said third side of said cage and said holes in said first guide rail and said first lead rail aligned therewith along said first locus, and said hooked portion of said first hooked locking pin is pivoted on said shank portion of said first hooked locking pin so as to engage with said first hooked catch.

2. A cage with a rectangular opening at a surface of a piece of computing equipment, as set forth in claim 1, in combination with:

said first hooked locking pin inserted through said first hole in said third side of said cage and through said hole in said first lead rail.

3. A combination as set forth in claim 2 in further combination with:

a compression spring for forcing said shank portion of said first hooked locking pin against the hook opening of said first hooked catch during said capturing thereof.

4. The further combination set forth in claim 3 wherein said compression spring is a coil spring through which said shank portion of said first hooked locking pin is inserted before its insertion through said first hole in said third side of said cage and through said hole in said first lead rail, said coil spring being compressed between said hooked portion of said first hooked locking pin and said third side of said cage.

5. A combination as set forth in claim 2 wherein said hook opening of said first hooked catch has a lip extending toward said third side of said cage.

6. A combination as set forth in claim 2 wherein the end of said shank portion of said first hooked locking pin distal from said hooked portion of said first hooked locking pin is pointed to facilitate said first hooked locking pin being inserted through said first hole in said third side of said cage and through said hole in said first lead rail.

7. A combination as set forth in claim 2 in further combination with:

said piece of peripheral equipment having said first guide rail located along said first side thereof and provided with said circular hole of a prescribed diameter therethrough along the extent thereof at said first prescribed distance from said rectangular front plate.

8. A cage with a rectangular opening at a surface of a piece of computing equipment, as set forth in claim 1 further comprising:

another lead rail located along said first side of said cage and paralleling said first lead rail, said other lead rail having a circular hole of said prescribed diameter therethrough along the extent thereof at substantially said first prescribed distance from said first edge of said rectangular opening.

9. A method for using said cage with a rectangular opening at a surface of a piece of computing equipment, as set forth in claim 1, for retaining said piece of peripheral equipment having said first guide rail located along said first side thereof% said method comprising the steps of:

sliding said piece of peripheral equipment into said cage, so that said first guide rail is supported by said first lead rail such that said holes through said first guide rail and said first lead rail are in substantial alignment, and so that said front plate of said piece of peripheral equipment closes off at least a portion of said rectangular opening at said surface of said piece of computing equipment;

inserting the shank portion of said first hooked locking pin through a compression coil spring, the first hole in said third side of said cage and the substantially aligned holes of said first guide rail and said first lead rail;

after so inserting the shank portion of said first hooked locking pin, pushing the hooked portion of said first hooked locking pin towards said third side of said cage for compressing said compression coil spring;

while so pushing, pivoting the hooked portion of said first hooked locking pin around the shank portion of said first hooked locking pin so as to oppose the hooked opening of said first hooked catch; and releasing said first hooked locking pin from said pushing thereof, to permit said compression coil spring to force the hooked portion of said first hooked locking pin against the hooked opening of said first hooked catch.

10. A cage with a rectangular opening at a surface of a piece of computing equipment, as set forth in claim 1, said cage for having inserted therewithin a piece of peripheral equipment with a rectangular front plate, with respective first and second sides parallel to each other and perpendicular to said rectangular front plate, with a first guide rail located along said first side thereof and with a second guide rail located along said second side thereof, said first guide rail having a circular hole of a prescribed diameter therethrough along the extent thereof at a first prescribed distance from said rectangular front plate, and said second guide rail having a circular hole of said prescribed diameter therethrough along the extent thereof at a second prescribed distance from said rectangular front plate; said cage being of such construction as to permit said piece of peripheral equipment being secured thereto using a second hooked locking pin, said second hooked locking pin having a substantially cylindrical shank portion of a diameter somewhat less than said prescribed diameter and having a hooked portion at substantially a right angle to its said respective shank portion; said cage further having:

a second lead rail located along said second side of said cage for engaging with said second guide rail of said peripheral equipment and extending perpendicularly from said second edge of said rectangular opening in said surface of said computing equipment, said second lead rail having a circular hole of said prescribed diameter therethrough along the extent thereof at substantially said second prescribed distance from said second edge of said rectangular opening;

a second circular hole of said prescribed diameter through said third side of said cage located such that a second perpendicular axis through its center extends through the center of said hole through said second lead rail and defines a second locus for the insertion of said shank portion of said second hooked locking pin; and a second hooked catch located near said second circular hole of said prescribed diameter through said third side of said cage, said second hooked catch having its hook opening towards said third side of said cage, said second hooked catch thereby being disposed for capturing said hooked portion of said second hooked locking pin when forced thereagainst after said piece of peripheral equipment is inserted into said cage, said shank portion of said second hooked locking pin is inserted through said second hole through said third side of said cage and those said holes in said guide and lead rails aligned therewith along said second locus, and said hooked portion of said second hooked locking pin is pivoted on said shank portion of said second hooked locking pin so as to engage with said second hooked catch.

11. A cage with a rectangular opening at a surface of a piece of computing equipment, as set forth in claim 10, wherein said first and second prescribed distances are equal each to the other.

12. A cage with a rectangular opening at a surface of a piece of computing equipment, as set forth in claim 11, in combination with:

said first hooked locking pin inserted through said first hole in said third side of said cage and through said hole in said first lead rail; and said second hooked locking pin inserted through said second hole in said third side of said cage and through said hole in said second lead rail.

13. A combination as set forth in claim 12 in further combination with:

a first compression spring for forcing said shank portion of said first hooked locking pin against the hook opening of said first hooked catch during said capturing thereof; and a second compression spring for forcing said shank portion of said second hooked locking pin against the hook opening of said second hooked catch during said capturing thereof.

14. The further combination set forth in claim 13 wherein said first compression spring is a first coil spring through which said shank portion of said first hooked locking pin is inserted before its insertion through said first hole in said third side of said cage and through said hole in said first lead rail, said first coil spring being compressed between said hooked portion of said first hooked locking pin and said third side of said cage; and wherein said second compression spring is a second coil spring through which said shank portion of said second hooked locking pin is inserted before its insertion through said second hole in said third side of said cage and through said hole in said second lead rail, said second coil spring being compressed between said hooked portion of said second hooked locking pin and said third side of said cage.

15. A combination as set forth in claim 12 wherein said hooked portions of said first and second hooked locking pins are each substantially cylindrical; wherein said hook opening of said first hooked catch is semicircular and is of such diameter such that said hooked portion of said first hooked locking pin nestles therewithin when forced thereagainst; and wherein said hook opening of said second hooked catch is semicircular and is of such diameter such that said hooked portion of said second hooked locking pin nestles therewithin when forced thereagainst.

16. A combination as set forth in claim 12, wherein the end of said shank portion of said first hooked locking pin distal from said hooked portion of said first hooked locking pin is pointed to facilitate said first hooked locking pin being inserted through said first hole in said third side of said cage and through said hole in said first lead rail, and wherein the end of said shank portion of said second hooked locking pin distal from said hooked portion of said second hooked locking pin is pointed to facilitate said second hooked locking pin being inserted through said second hole in said third side of said cage and through said hole in said second lead rail.

17. A combination as set forth in claim 12 in further combination with:

said piece of peripheral equipment.

18. A cage with a rectangular opening at a surface of a piece of computing equipment, as set forth in claim 10 further comprising:

a third lead rail located along said first side of said cage and paralleling said first lead rail, said third lead rail having a circular hole of said prescribed diameter therethrough along the extent thereof at substantially said first prescribed distance from said first edge of said rectangular opening; and a fourth lead rail located along said second side of said cage and paralleling said second lead rail, said fourth lead rail having a circular hole of said prescribed diameter therethrough along the extent thereof at substantially said second prescribed distance from said second edge of said rectangular opening.

19. A method for using said cage with a rectangular opening at a surface of a piece of computing equipment, as set forth in claim 10, for retaining said piece of peripheral equipment having said first guide rail located along said first side thereof and having said second guide rail located along said second side thereof, said method comprising the steps of:

sliding said piece of peripheral equipment into said cage, so that said first and second guide rails are respectively supported by said first and second lead rails, so that said holes through said first guide rail and said first lead rail are in substantial alignment, so that said holes through said second guide rail and said second lead rail are in substantial alignment, and so that said front plate of said piece of peripheral equipment closes off at least a portion of said rectangular opening at said surface of said piece of computing equipment;

inserting the shank portion of said first hooked locking pin through a first compression coil spring, the first hole in said third side of said cage and the substantially aligned holes of said first guide rail and said first lead rail;

after so inserting the shank portion of said first hooked locking pin, pushing the hooked portion of said first hooked locking pin towards said third side of said cage for compressing said first compression coil spring;

while so pushing, pivoting the hooked portion of said first hooked locking pin around the shank portion of said first hooked locking pin so as to oppose the hooked opening of said first hooked catch;

releasing said first hooked locking pin from said pushing thereof, to permit said first compression coil spring to force the hooked portion of said first hooked locking pin against the hooked opening of said first hooked catch inserting the shank portion of said second hooked locking pin through a second compression coil spring, the second hole in said third side of said cage and the substantially aligned holes of said second guide rail and said second lead rail;

after so inserting the shank portion of said second hooked locking pin, pushing the hooked portion of said second hooked locking pin towards said third side of said cage for compressing said second compression coil spring;

while so pushing, pivoting the hooked portion of said second hooked locking pin around the shank portion of said second hooked locking pin so as to oppose the hooked opening of said second hooked catch;

releasing said second hooked locking pin from said pushing, to permit said second compression coil spring to force the hooked portion of said second hooked locking pin against the hooked opening of said second hooked catch.

* * * * *

UNITED STATES PATENT AND TRADEMARK OFFICE
CERTIFICATE OF CORRECTION

PATENT NO. : 5,510,955
DATED : April 23, 1996
INVENTOR(S) : Tae Sang Kim

It is certified that error appears in the above-indentified patent and that said Letters Patent is hereby corrected as shown below:

Column 10, line 9, change "thereof%" to --thereof,--.

Signed and Sealed this

Thirtieth Day of July, 1996

Attest:

BRUCE LEHMAN

*Attesting Officer*   *Commissioner of Patents and Trademarks*